United States Patent

Munakata

[11] Patent Number: 6,125,554
[45] Date of Patent: Oct. 3, 2000

[54] METHOD AND APPARATUS FOR DRYING FLAT OBJECTS

[75] Inventor: Hideki Munakata, Nishishirakawa, Japan

[73] Assignee: Shin-Etsu Handotai Co., Ltd., Tokyo, Japan

[21] Appl. No.: 08/901,166

[22] Filed: Jul. 28, 1997

[30] Foreign Application Priority Data

Aug. 6, 1996 [JP] Japan .................................. 8-223136

[51] Int. Cl.⁷ ...................................................... F26B 5/04
[52] U.S. Cl. ........................... 34/469; 34/92; 211/41.12; 134/95.2; 134/902; 118/500
[58] Field of Search ................................. 34/361, 362, 403, 34/467, 469, 74, 92, 237; 211/41.12; 134/95.2, 21, 902; 118/500, 501

[56] References Cited

U.S. PATENT DOCUMENTS

| | | |
|---|---|---|
| 4,643,774 | 2/1987 | Kishida et al. . |
| 5,054,988 | 10/1991 | Shiraiwa . |
| 5,381,808 | 1/1995 | Kamikawa . |
| 5,520,744 | 5/1996 | Fujikawa et al. ........................ 134/11 |
| 5,704,493 | 1/1998 | Fujikawa et al. ........................ 211/41 |

FOREIGN PATENT DOCUMENTS

| | | |
|---|---|---|
| 0651438 A1 | 5/1995 | European Pat. Off. . |
| 2221037 | 10/1974 | France . |
| 5-259264 | 10/1993 | Japan . |
| B2-6-93449 | 11/1994 | Japan . |

*Primary Examiner*—Pamela A. Wilson
*Attorney, Agent, or Firm*—Oliff & Berridge, PLC

[57] ABSTRACT

There are disclosed a method and an apparatus for drying a flat object. At least one flat object, whose surface is covered entirely with adhering water, is placed substantially vertically in at least one groove portion formed in a rack. The rack has a cavity portion formed therein, and the cavity portion communicates with the groove portion through at least one opening. The cavity portion of the rack is depressurized in order to suck water adhering to the surface of the flat object through the opening, thereby drying the flat object. It becomes possible to dry the flat object without causing problems which have been occurred in conventional drying methods.

19 Claims, 5 Drawing Sheets

METHOD AND APPARATUS FOR DRYING FLAT OBJECTS

BACKGROUND OF THE INVENTION

1. Field of the Invention

The present invention relates to a method and an apparatus for drying flat objects, particularly semiconductor wafers such as silicon wafers.

2. Description of the Related Art

In a process of manufacturing flat objects, such as lenses, optical discs, liquid crystal panels, solar cells, silicon wafers, and wafers of compound semiconductors such as GaAs compound semiconductor, GaP compound semiconductor, and InP compound semiconductor, the flat objects are cleaned and then dried. Conventionally, such flat objects are dried through use of one or more of the following methods: a method in which flat objects are exposed to a vapor of an organic solvent such as isopropyl alcohol (IPA) to thereby be dried through replacement of water present thereon with the organic solvent (IPA drying or the like); a method in which flat objects placed in a carrier are subjected to a centrifugal force to centrifugally remove adhering water, thereby drying the flat objects (spin drying); a method in which flat objects are subjected to heat from a heat source such as a halogen lamp to thereby be dried through evaporation of water (IR drying); a method in which flat objects are immersed in hot pure water and are then gradually pulled up to thereby be dried through utilization of surface tension of pure water (drying through pull-up from hot water; see Japanese Patent Publication (kokoku) No. 6-93449); and a method in which flat objects are placed in a sealed drying container, and the container is evacuated under reduced pressure to thereby dry the flat objects through removal of evaporating water (drying under reduced pressure).

However, these conventional drying methods involve the following problems. Drying through use of an organic solvent such as IPA drying involves a potential danger of explosion or fire due to volatility of an organic solvent, and thus safety is endangered. In spin drying through utilization of a centrifugal force, cleanliness of flat objects may be impaired due to particle generation induced by contact between flat objects and a carrier and from a revolving drive component during rotation thereof. In IR drying with a halogen lamp or a like heat source, flat objects can in principle only be dried one by one, resulting in relatively low productivity. In drying through pull-up from hot water utilizing surface tension of water, flat objects must be pulled up very slowly from hot water, resulting in significantly low productivity. In drying under reduced pressure through evacuation of a container under reduced pressure, there arises a problem that water is condensed due to removal of heat of gasification.

SUMMARY OF THE INVENTION

The present invention has been accomplished to solve the above-mentioned problems, and an object of the invention is to provide a method and an apparatus for drying flat objects without involving such problems.

The inventors of the present invention have found that the aforementioned problems involved in conventional drying methods do not occur when flat objects are dried in the following manner: flat objects, whose surface is covered entirely with adhering water, are placed substantially vertically in groove portions formed in a rack in which there is formed a cavity portion which opens to the groove portions through openings, and the cavity portion is then depressurized to thereby forcibly remove water adhering to the surface of the flat objects through the openings, thereby drying the flat objects. This method does not use a solvent such as an organic solvent, is free from particle generation, and can be employed to dry a plurality of flat objects in batch. Also, in this method, flat objects are pulled up at an ordinary speed from a pure water bath serving as a cleaning bath and are then placed on a rack. Accordingly, productivity is not impaired, and there is no need for placing flat objects in a sealed drying container for the purpose of drying through evacuation under reduced pressure. Thus, this method does not involve problems with regard to cleanliness, running cost, productivity, safety, or automation.

The present invention provides a method for drying a flat object, comprising the steps of: placing at least one flat object, all of whose surface is covered entirely with adhering water, substantially vertically in at least one groove portion formed in a rack in which there is formed a cavity portion which opens to the groove portion through at least one opening of the cavity portion; and depressurizing the cavity portion to thereby suck water adhering to the surface of the flat object through the opening, thereby drying the flat object.

Preferably, the flat object is placed on the rack immediately after the flat object is taken out from a pure water bath, to thereby prevent a dry portion from being formed on the surface of the flat object. The flat object may be taken out from the pure water bath while the pure water bath is overflowing with water or after water is drained from the pure water bath. In either case, the surface of the flat object must be entirely wetted with water, i.e. water must cover the entire surface of the flat object. Preferably, pure water contained in the pure water bath is at room temperature.

Further, the present invention provides an apparatus for drying a flat object which comprises a rack which has at least one groove portion for receiving a flat object to be placed substantially vertically therein, a cavity portion, and at least one opening for connecting the cavity portion with the groove portion; and means for depressurizing the cavity portion.

The method and the apparatus of the present invention are particularly suited for drying silicon wafers and wafers of GaAs compound semiconductor, GaP compound semiconductor, InP compound semiconductor, or a like compound semiconductor.

According to the present invention, an organic solvent such as isopropyl alcohol is not used, particle generation is free, and a plurality of flat objects can be dried in batch. Also, flat objects are pulled up at an ordinary speed from a pure water bath serving as a cleaning bath and are then placed on a rack. Accordingly, productivity is not impaired, and there is no need for placing flat objects in a sealed drying container for the purpose of drying through evacuation under reduced pressure. Thus, the drying method and the drying apparatus according to the present invention are excellent in terms of cleanliness, running cost, productivity, safety, and automation.

DESCRIPTION OF THE PREFERRED EMBODIMENTS

Embodiments of the present invention will now be described with reference to the drawings.

Figure 1:
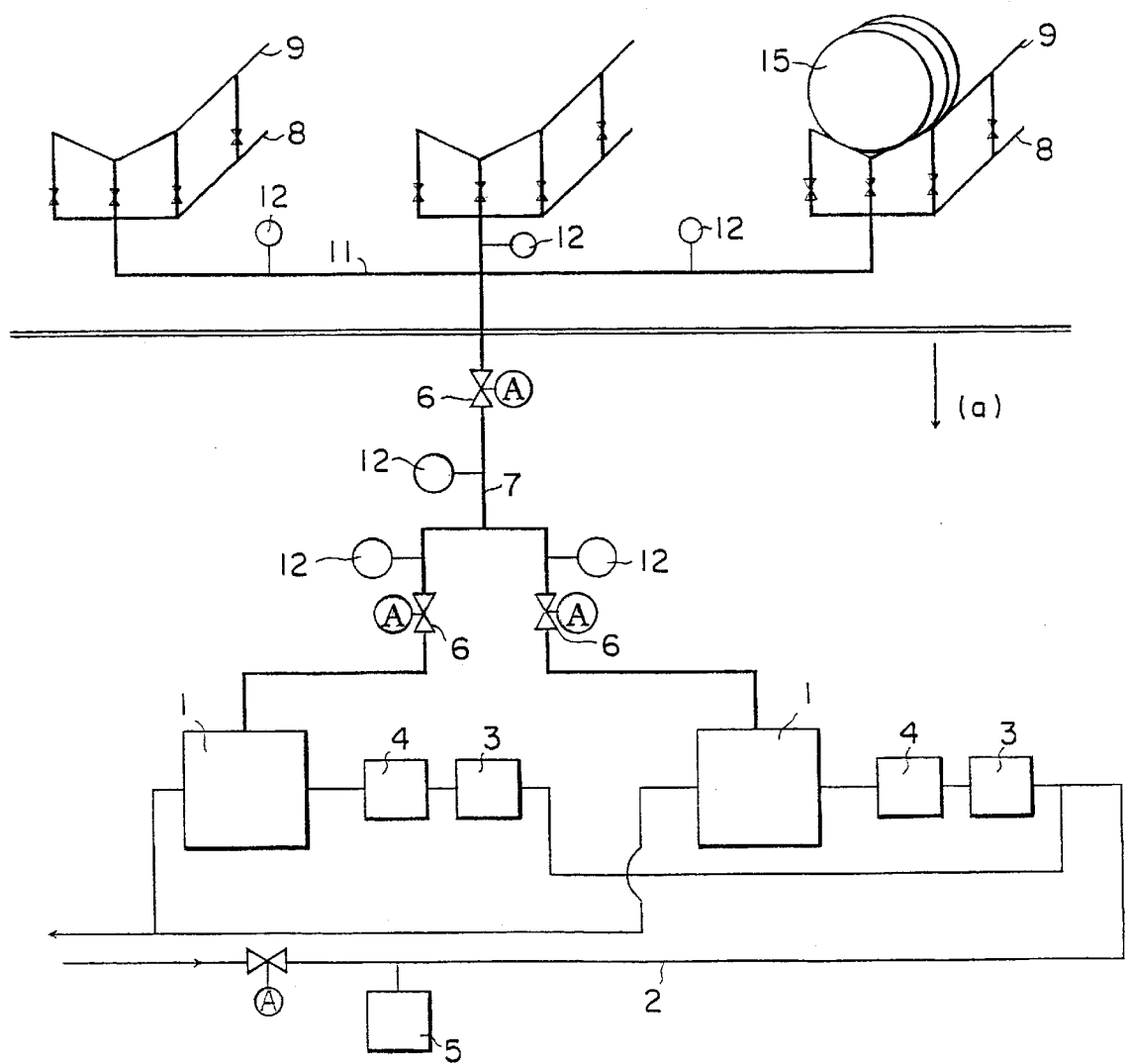
FIG. 1 is a schematic diagram of an apparatus for drying flat objects according to an embodiment of the present invention.

As shown in FIG. 1, an apparatus for drying flat objects according to the present invention has vacuum pumps 1 for depressurizing the cavity portions of racks 9. Since the vacuum pumps 1 are of a water ring type, there is provided piping 2 for feeding chiller water to the vacuum pump 1. When a solenoid valve 3 opens, chiller water is fed to the vacuum pump 1. In the case where the vacuum pump 1 does not have a built-in flow control valve, a float 4 is used to adjust the amount of chiller water fed to the vacuum pump 1. In the case where the vacuum pump 1 has a built-in flow control valve, the float 4 may not be used. Since the vacuum pump 1 is started after a float switch 5 confirms that the piping 2 is filled with chiller water, the vacuum pump 1 will not be operated in an unsealed state.

In order to dry a number of wafers at a time, the drying apparatus of FIG. 1 includes three racks 9 and two vacuum pumps 1 for securing the capability of evacuating the three racks 9.

When the vacuum pumps 1 start, the air valves 6 open. Main piping 7 is connected to piping 8 which, in turn, is connected to the racks 9 to thereby communicate with the cavity portion of the racks 9. Thus, air around flat objects is sucked through at least one opening of the cavity portion. Pressure reduction is adjusted by pressure regulating valves installed in the main piping 7, piping 11 which branches off from the main piping 7, and piping 8 which branches off from the piping 11 and is connected to each rack 9. In order to monitor the degree of pressure reduction, a vacuum gauge 12 is installed in each of pipings 7, 11, and 8 on the downstream side of the corresponding pressure regulating valve.

Figure 2A:
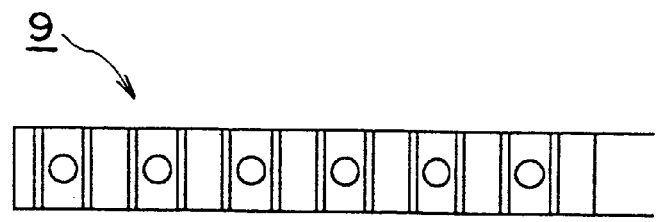
FIG. 2A is a plan view of a part of a rack used in the embodiment.
Figure 2B:
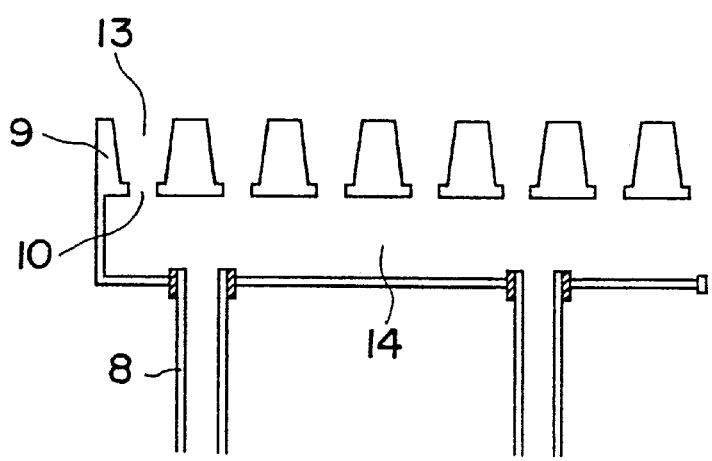
FIG. 2B is a sectional view of the part of the rack of FIG. 2A.

In each of the racks 9, a plurality of groove portions (not shown in FIG. 1) are formed for allowing individual flat objects to be placed substantially vertically therein, and there is formed a cavity portion (not shown in FIG. 1) which opens to the groove portions through at least one opening. FIG. 2 shows an example of the rack 9. In the rack 9 of FIG. 2, each groove portion 13 has a substantially V-shaped cross section, a cavity portion 14 is formed, and an opening 10 is formed in the bottom of the groove portion 13.

The racks 9 must be installed within a clean room, but the vacuum pumps 1 are preferably installed in the exterior (a) of the clean room.

In the drying apparatus having the above-described structure, when the vacuum pump 1 is started, air around flat objects 15 is sucked through the openings 10 to thereby suck water adhering to the surface of the flat objects 15. Accordingly, the wet flat objects 15 can be dried simply by placing them on the rack 9.

Upon completion of cleaning with pure water, flat objects are held with arms and are then quickly pulled up from a pure water bath while the pure water bath is overflowing with pure water, and subsequently the flat objects are placed on a rack. Alternatively, after pure water is quickly drained from the pure water bath by opening a drain valve, flat objects are held with arms and are then pulled up from the pure water bath, and subsequently the flat objects are placed on a rack. In either case, in order to prevent a dry portion from being formed on the surface of any of the flat objects, the flat objects must be immediately placed on the rack. In the latter case, a manual valve is usually provided to adjust a drainage velocity. A higher drainage velocity is preferred. When the drain valve is opened, a pure water feed valve, which is opened for feeding pure water to the pure water bath, is automatically closed. A pump may be used to drain pure water from the pure water tank. Pure water adhering to the tip portions of the arms, if any, is preferably removed by air blow or the like, before flat objects are held by the arms.

After being cleaned in a cleaning step, flat objects are dried by the drying method and the drying apparatus of the present invention. Next, examples of the drying step will be described specifically for the case of semiconductor wafers.

Figure 3:
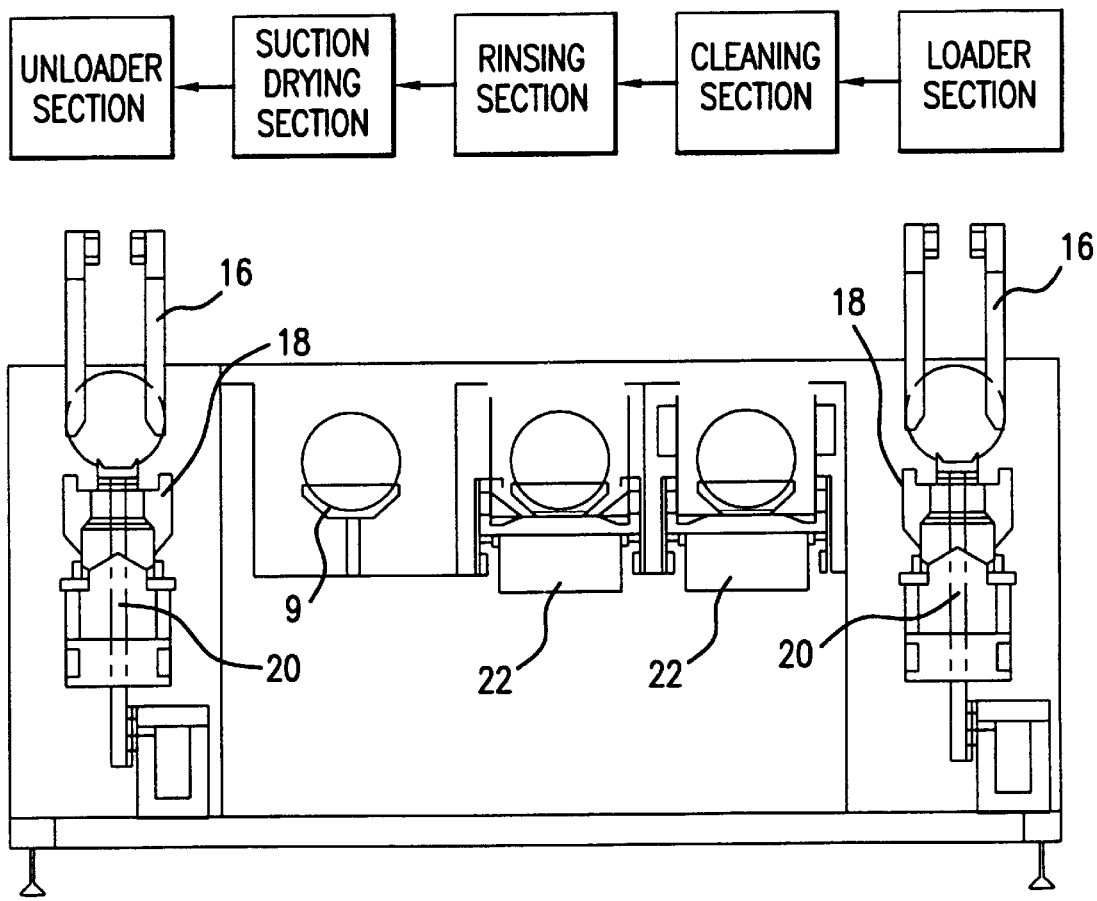
FIG. 3 is a view illustrating a cleaning step and a drying step for semiconductor wafers in the case where flat objects are taken out from a pure water bath while the pure water bath is overflowing with pure water.

1. Flat objects are taken out from a pure water bath while the pure water bath is overflowing with pure water:

FIG. 3 illustrates a cleaning step and a drying step for semiconductor wafers in this case. As shown in FIG. 3, a cassette 18 which holds wafers is placed on the platform of a loader section. Next, the wafers are pushed out of the cassette 18 through use of wafer-pushing means 20. Subsequently, the wafers are held by cassetteless arms 16 and are then pulled up and transferred to a cleaning solution bath of a cleaning section. The thus-transferred wafers are placed on a rack in the cleaning solution bath and are then released. Then, the wafers are cleaned in the cleaning solution bath. Next, the wafers in the cleaning solution bath are held again by the cassetteless arms 16 and are then pulled up and transferred to the next pure water bath of a rinsing section, serving as a rinsing bath. The thus-transferred wafers are placed on a rack in the pure water bath and are then released. The pure water bath is continuously fed with pure water and is thus overflowing with pure water. In this pure water bath, cleaning solution adhering to the wafers is washed off. An ultrasonic generator 22 applies ultrasound, as needed, to the cleaning solution bath and the rinsing bath.

Upon completion of rinsing, the wafers are held by the cassetteless arms 16 and are then pulled up quickly and transferred to the drying apparatus of the present invention. The thus-transferred wafers are placed on the rack 9 and are then released. In the drying apparatus of a suction drying section, the wafers are dried through evacuation in accordance with the drying method of the present invention. That is, pure water adhering to the entire surfaces of the wafers is forcibly drawn out. Then, the thus-dried wafers are held again by the cassetteless arms 16 and are then pulled up and transferred to an unloader section. The thus-transferred wafers are placed again in the cassette 18.

2. Flat objects are taken out from a pure water bath after pure water is drained from the pure water bath;

Semiconductor wafers follow a procedure similar to that of Case 1 described above until the wafers are placed on a rack in the pure water bath and are then released. After cleaning solution adhering to the wafers is washed off by making the pure water bath overflow with pure water, pure water fed to the pure water bath is shut off. Subsequently, pure water is completely drained from the pure water bath. Then, the wafers are held by the cassetteless arms and are then pulled up and transferred to the drying apparatus. The thus-transferred wafers are placed on the rack in the drying apparatus and are then released. Subsequently, the wafers follow a procedure similar to that of Case 1 described above.

EXAMPLES

The present invention will next be described by way of example.

Example and Comparative Example

Silicon wafers having an 8-inch diameter were dried by the method of the present invention (Example) and through use of IPA (Comparative Example).

In Comparative Example, 8-inch wafers were subjected to SC-1 cleaning (in which solution containing $NH_4OH$, $H_2O_2$, and $H_2O$ (1:1:5) was used) and were then rinsed with pure water of room temperature. The thus-rinsed wafers were dried through use of IPA.

In Example, 8-inch wafers were subjected to SC-1 cleaning and were then rinsed with pure water of room temperature. After the pure water bath used for rinsing was drained completely of pure water, the wafers were dried using the apparatus of FIG. 1. In this case, the wafers were placed on the racks in which openings having a 3 mm diameter were formed in the groove portions, and pure water adhering to the wafers was drawn out through use of a vacuum pump. Pure wafer was drained from the pure water bath at a drainage velocity that lowers the pure water level in an amount of 4 mm/second. This drainage was completed in one minute.

In Comparative Example, drying was performed 17 times on 7 wafers each. In Example, drying was performed 15 times on 7 wafers each. The thus-dried wafers were checked for the number of particles. The test results are shown in FIGS. 4A–4D.

Figure 4A:
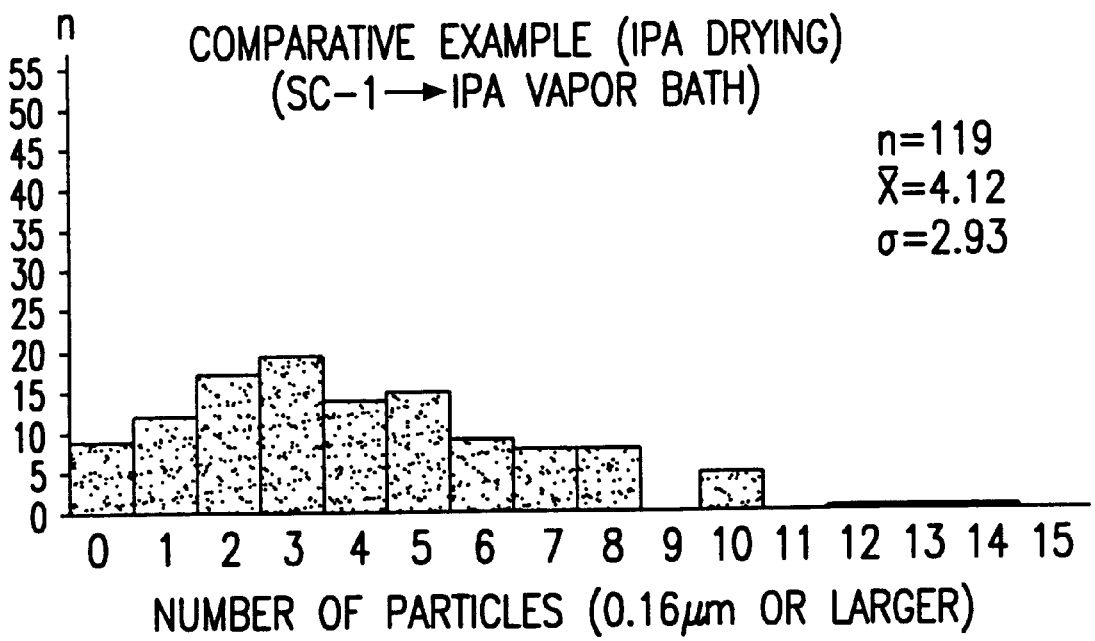
FIG. 4 shows graphs showing the particle level of 8-inch silicon wafers which were dried through use of IPA, and the particle level of 8-inch silicon wafers which were dried in accordance with the present invention.
Figure 4B:
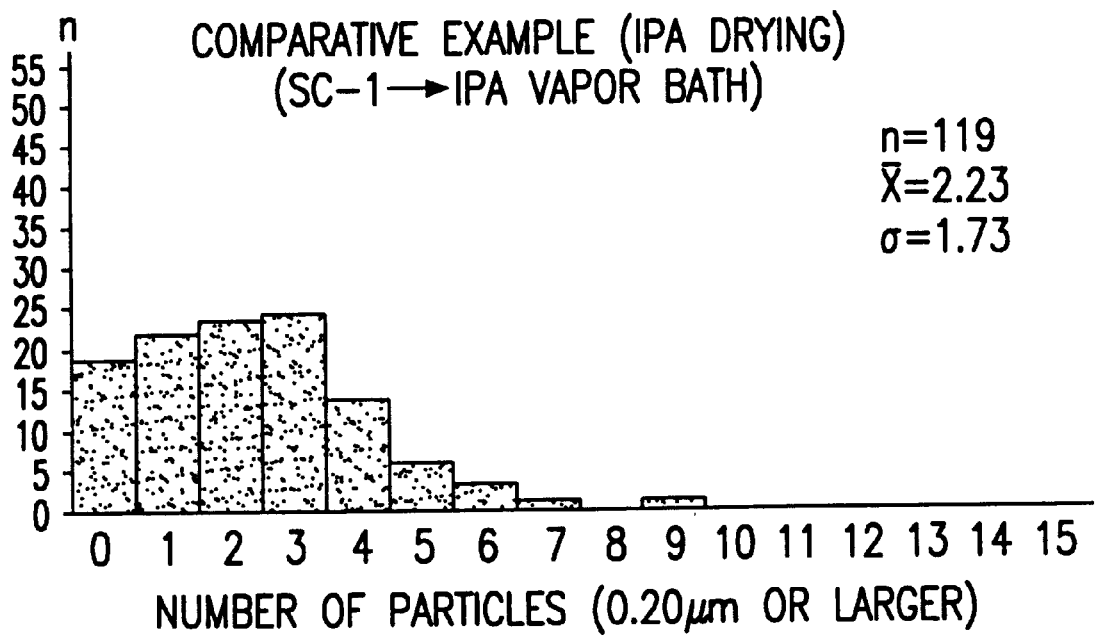
Figure 4C:
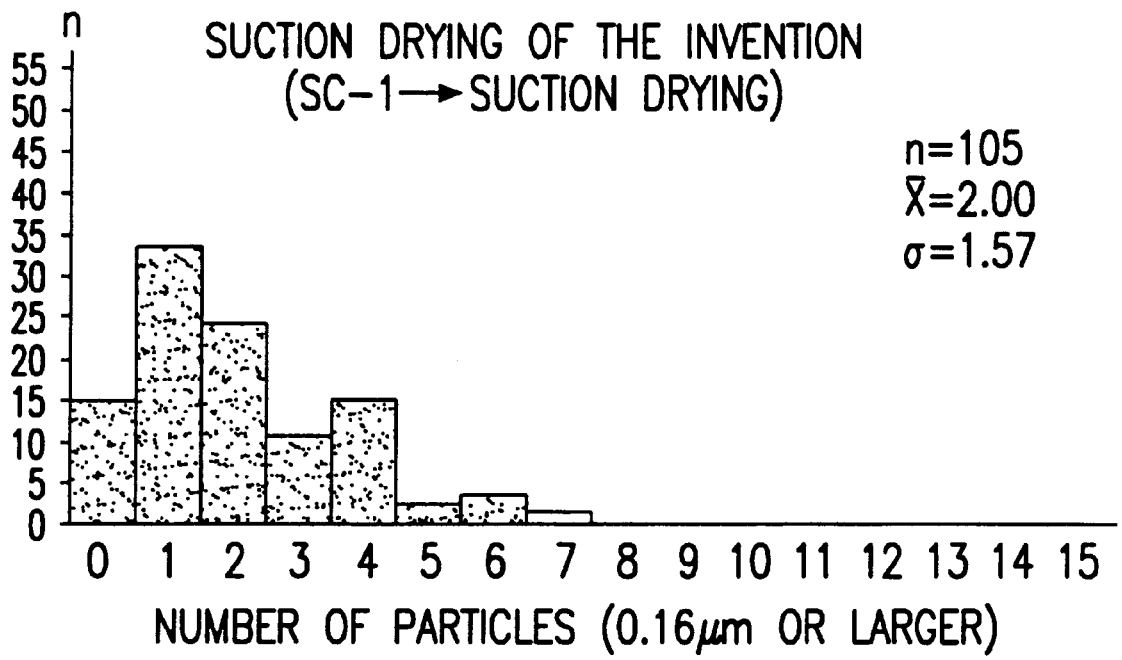
Figure 4D:
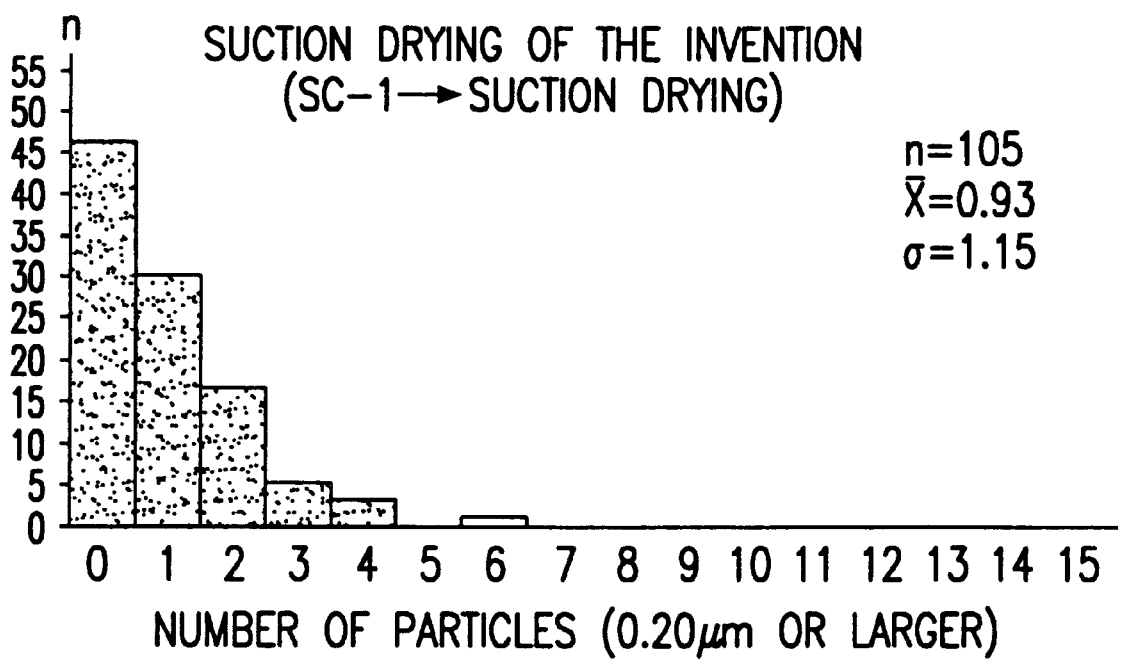

FIGS. 4A and 4B show the test results of Comparative Example, illustrating the number of dried wafers in each of ranges regarding the number of particles having a particle size of 0.16 μm or larger and the number of dried wafers in each of ranges regarding the number of particles having a particle size of 0.20 μm or larger. FIGS. 4C and 4D show the test results of Example, illustrating the number of dried wafers in each of ranges regarding the number of particles having a particle size of 0.16 μm or larger and the number of dried wafers in each of ranges regarding the number of particles having a particle size of 0.20 μm or larger.

As seen from FIG. 4, dried wafers of Example show a smaller number of particles than those of Comparative Example.

The present invention is not limited to the above-described embodiments. The above-described embodiments are mere examples, and those having the substantially same structure as that described in the appended claims and providing the similar action and effects are included in the scope of the present invention.

For example, the above embodiments are described while mentioning a drying apparatus using three racks and two vacuum pumps. However, the present invention is not limited thereto, and a greater number of or a smaller number of racks and means for depressurizing the cavity portion of a rack may be employed; for example, one rack and one depressurizing means may be employed. In the above example, 8-inch silicon wafers were dried. However, the present invention is not limited thereto, and flat objects having a diameter of not less than 10 inches or not greater than 6 inches may be dried. Further, in the above example, 7 wafers were dried at a time. However, the present invention is not limited thereto, and a greater number of flat objects may be dried if a rack can accommodate them, or a smaller number of flat objects, for example, one flat object may be dried.

What is claimed is:

1. A method for drying a flat object, comprising the steps of:

providing a rack which has at least one groove portion, a cavity portion, and at least one opening for connecting the cavity portion with the groove portion;

placing at least one flat object, whose surface is covered entirely with adhering water, substantially vertically in the groove portion of the rack; and depressurizing the cavity portion of the rack in order to suck water adhering to the surface of the flat object through the opening, thereby drying the flat object.

2. A method for drying a flat object according to claim 1, wherein the flat object is placed on the rack immediately after the flat object is taken out from a pure water bath, to thereby prevent a dry portion from being formed on the surface of the flat object.

3. A method for drying a flat object according to claim 2, wherein the flat object is taken out from the pure water bath while the pure water bath is overflowing with water.

4. A method for drying a flat object according to claim 3, wherein the pure water contained in the pure water bath is at room temperature.

5. A method for drying a flat object according to claim 4, wherein the flat object is a wafer of a semiconductor material selected from the group consisting of silicon semiconductor, GaAs compound semiconductor, GaP compound semiconductor, and InP compound semiconductor.

6. A method for drying a flat object according to claim 3, wherein the flat object is a wafer of a semiconductor material selected from the group consisting of silicon semiconductor, GaAs compound semiconductor, GaP compound semiconductor, and InP compound semiconductor.

7. A method for drying a flat object according to claim 2, wherein the flat object is taken out from the pure water bath after water is drained from the pure water bath.

8. A method for drying a flat object according to claim 7, wherein the pure water contained in the pure water bath is at room temperature.

9. A method for drying a flat object according to claim 8, wherein the flat object is a wafer of a semiconductor material selected from the group consisting of silicon semiconductor, GaAs compound semiconductor, GaP compound semiconductor, and InP compound semiconductor.

10. A method for drying a flat object according to claim 7, wherein the flat object is a wafer of a semiconductor material selected from the group consisting of silicon semiconductor, GaAs compound semiconductor, GaP compound semiconductor, and InP compound semiconductor.

11. A method for drying a flat object according to claim 2, wherein the pure water contained in the pure water bath is at room temperature.

12. A method for drying a flat object according to claim 11, wherein the flat object is a wafer of a semiconductor material selected from the group consisting of silicon semiconductor, GaAs compound semiconductor, GaP compound semiconductor, and InP compound semiconductor.

13. A method for drying a flat object according to claim 2, wherein the flat object is a wafer of a semiconductor material selected from the group consisting of silicon semiconductor, GaAs compound semiconductor, GaP compound semiconductor, and InP compound semiconductor.

14. A method for drying a flat object according to claim 1, wherein the flat object is a wafer of a semiconductor material selected from the group consisting of silicon semiconductor, GaAs compound semiconductor, GaP compound semiconductor, and InP compound semiconductor.

15. An apparatus for drying a flat object, comprising:
a rack which has at least one groove portion for receiving a flat object to be placed substantially vertically therein, a cavity portion, and at least one opening for connecting the cavity portion with the groove portion; and
means connected to the cavity portion for depressurizing the cavity portion of the rack.

16. An apparatus for drying a flat object according to claim 15, wherein the flat object is a wafer of a semiconductor material selected from the group consisting of silicon semiconductor, GaAs compound semiconductor, GaP compound semiconductor, and InP compound semiconductor.

17. An apparatus for drying a flat object, comprising:
a rack including at least one groove portion for supporting a flat object in a substantially vertical orientation on the rack, a cavity portion, and at least one opening through which the groove portion communicates with the cavity portion; and
at least one vacuum pump connected to the cavity portion, the vacuum pump depressurizes the cavity portion to draw water covering the surface of the flat object through the opening and into the cavity portion, thereby drying the flat object.

18. An apparatus for drying a flat object according to claim 17, wherein the rack comprises a plurality of groove portions, and each groove portion communicates with the cavity portion through a respective opening.

19. An apparatus for drying a flat object according to claim 18, further comprising a plurality of vacuum pumps connected to the cavity portion.

* * * * *